US010784878B1

(12) United States Patent
Sukumaran et al.

(10) Patent No.: US 10,784,878 B1
(45) Date of Patent: Sep. 22, 2020

(54) DIGITAL TO ANALOG CONVERTER TOLERANT TO ELEMENT MISMATCH

(71) Applicant: Steradian Semiconductors Private Limited, Bangalore (IN)

(72) Inventors: Amrith Sukumaran, Bangalore (IN); Gireesh Rajendran, Bangalore (IN); Ashish Lachhwani, Bangalore (IN)

(*) Notice: Subject to any disclaimer, the term of this patent is extended or adjusted under 35 U.S.C. 154(b) by 0 days.

(21) Appl. No.: 16/724,195

(22) Filed: Dec. 21, 2019

(51) Int. Cl.
*H03M 1/06* (2006.01)
*H03M 1/14* (2006.01)
*H03M 1/78* (2006.01)
*H03H 11/30* (2006.01)

(52) U.S. Cl.
CPC ......... *H03M 1/0604* (2013.01); *H03H 11/30* (2013.01); *H03M 1/145* (2013.01); *H03M 1/785* (2013.01)

(58) Field of Classification Search
CPC .... H03M 1/0604; H03M 1/785; H03M 1/145; H03H 11/30
USPC .................................................. 341/155, 118
See application file for complete search history.

(56) References Cited

U.S. PATENT DOCUMENTS

| 5,754,134 A * | 5/1998 | Shou | H03M 1/145 341/155 |
| 7,961,126 B2 * | 6/2011 | Deval | H03M 3/33 341/131 |
| 8,269,661 B2 * | 9/2012 | Corsi | H03M 1/069 341/161 |

* cited by examiner

*Primary Examiner* — Brian K Young

(57) ABSTRACT

According to an aspect, a tri-level digital to analog converter (DAC) comprises a first set of switches turned on to cause a first analog value with a first error as an output for a first digital value, a second set of switches turned on to cause a second analog value with a second error as the output for a second digital value, wherein, both the first set of switches and the second set of switches are turned on to cause a third analog value, proportional to the first error and the second error, as the output for a digital value equal to zero, and both the first set of switches and the second set of switches are turned off to cause a fourth analog value equal to zero as the output for a fourth digital value representing a reset state.

8 Claims, 7 Drawing Sheets

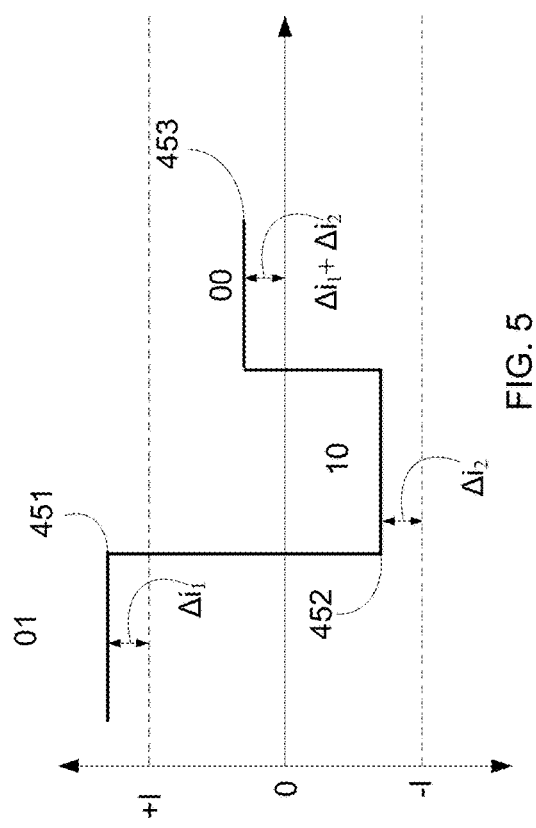
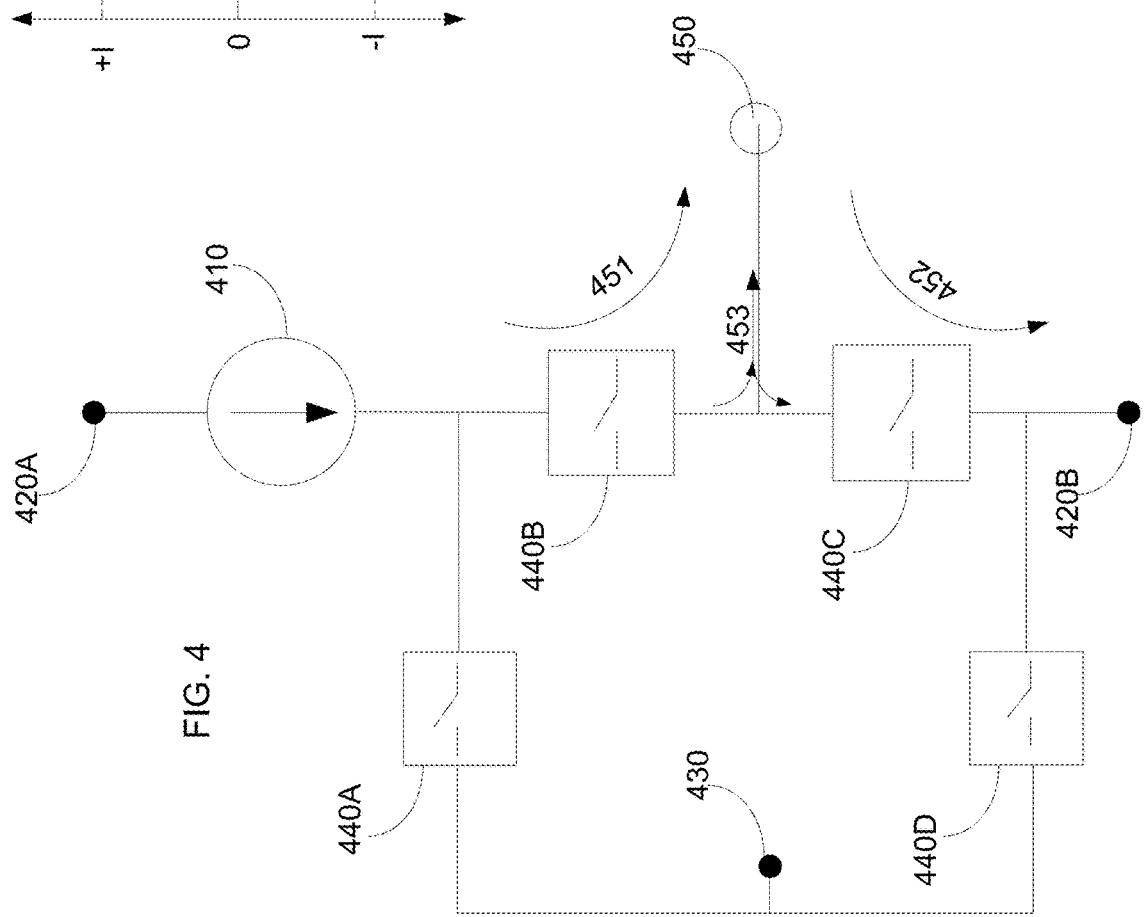

DIGITAL TO ANALOG CONVERTER TOLERANT TO ELEMENT MISMATCH

CROSS REFERENCES TO RELATED APPLICATIONS

This application claims priority from Indian patent application No. 201941042293 filed on Oct. 18, 2019 which is incorporated herein in its entirety by reference

BACKGROUND

Technical Field

Embodiments of the present disclosure relate to data processing electronic devices and in particular relates to a Digital to Analog Converter (DAC)tolerant to elements mismatch

Related Art

DACs are often employed to convert digital data to analog values. Particularly, in a high speed and high-resolution analog to digital convertor (ADC), the DACs are employed in a feedback loop of the ADC for noise shaping and for other benefits as is well known in the art.

Quantization noise is often reduced by implementing more number of quantization levels. In such case, implementing the DAC with higher number of levels presents a stringent requirement on matching the characteristics of the elements. On the other hand, implementing the DAC with fewer levels increases the quantization noise of the ADC. In one conventional implementation, a three level DAC (Tri-level DAC) is employed as a tradeoff. However, in such conventional Tri-level DAC, mismatch between the elements causes an error, thereby reducing the operational bandwidth and/or dynamic range of the ADC.

One conventional Tri-level DAC implementation is described in a paper titled "A 174.3 dB FoM VCO-Based CT $\Delta\Sigma$ Modulator with a Fully Digital Phase Extended Quantizer and Tri-Level Resistor DAC in 130 nm CMOS" by Shaolan Li et. al published in the proceedings of IEEE, ESSCIRC 2016, which is incorporated herein by reference. As may be appreciated, in this conventional Tri-level DAC, three different paths are excited for the three codes/levels (+1,0,−1) and mismatch among elements such as switches, routing resistance, other sources, causes the transfer characteristics of the conventional DAC to be non-linear. Further, as may be seen, the signal dependent currents are drawn from Vrefp (DAC reference) resulting in distortion due to finite series impedance to Vrefp generator. Further, in this Tri-level CMOS DAC, control signals require to swing rail-to-rail, thereby rendering it not suitable for low-voltage digital clock driver implementation.

Another conventional Tri-level DAC is disclosed in the U.S. Pat. No. 9,397,676, which is incorporated herein by reference. As may be appreciated, in this conventional Tri-level DAC, the level zero is implemented as diverting the DAC current to a reference path. Further a digital encoder/mapper block is incorporated to generate such control signals to control the DAC. As may be seen, any mismatch in level 1 (say 1+Δ) and −1 (say −1×Δ) is not compensated in level 0 and thus, resulting in a distortion. Also, this DAC has time-varying output impedance (in practical scenarios where current sources have finite output impedance) and hence when feeding its output to a continuous time circuit causes modulation.

SUMMARY

According to an aspect, a tri-level digital to analog converter (DAC) comprises a first set of switches turned on to cause a first analog value with a first error as a output for a first digital value, a second set of switches turned on to cause a second analog value with a second error as the output for a second digital value, wherein, both the first set of switches and the second set of switches are turned on to cause a third analog value, proportional to the combination of first error and the second error, as the output for a digital value equal to zero, and both the first set of switches and the second set of switches are turned off to cause a fourth analog value equal to zero as the output for a fourth digital value representing a reset state.

According to another aspect, a high speed analog to digital convertor (ADC) comprises a subtractor configured to generate a difference signal as a difference of an input analog signal and a feedback analog signal, a loop filter configured to perform anti-aliasing filtering on the difference signal to provide a filtered difference signal, a sampler configured to generate a sequence of samples of the filtered difference signal, an internal ADC with three level quantizer is configured to convert each sample to corresponding one of a three digital values; and a tri level digital to analog convertor (DAC) configured to generate the feedback analog signal corresponding to the three digital values such that, an element mismatch error in the feedback analog signal corresponding to the three digital values is substantially same.

According to yet another aspect, a method of converting the digital bits representing a positive, a negative and a zero value to corresponding analog values comprises converting the digital bits representing the positive value to first positive analog level, converting the digital bits representing the negative value to first negative analog level and converting the digital bits representing the zero value to a analog level that is centred between the positive analog level and the negative analog level even when the positive analog level and the negative analog level are shifted by a first error and a second error due to an element mismatch.

Several aspects are described below, with reference to diagrams. It should be understood that numerous specific details, relationships, and methods are set forth to provide full understanding of the present disclosure. Skilled personnel in the relevant art, however, will readily recognize that the present disclosure can be practiced without one or more of the specific details, or with other methods, etc. In other instances, well-known structures or operations are not shown in detail to avoid obscuring the features of the present disclosure.

BRIEF DESCRIPTION OF DRAWINGS

FIG. 4 is an example DAC providing analog signal with reduced error due to element mismatch in an embodiment.

FIG. 5 is a graph illustrating error in the feedback current in an embodiment.

DETAILED DESCRIPTION OF THE PREFERRED EXAMPLES

Figure 1:
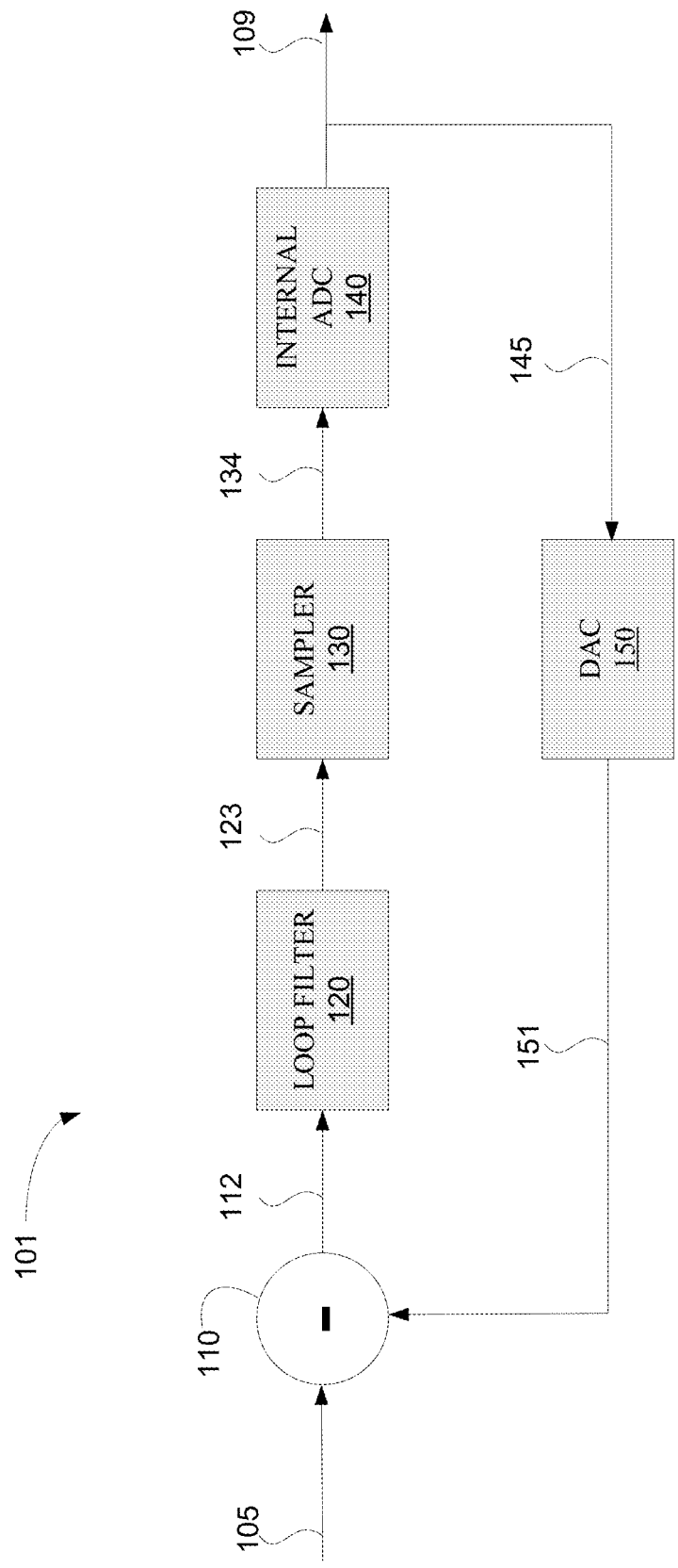
FIG. 1 is block diagram illustrating a high speed analog to digital converter (ADC) in an embodiment.

FIG. 1 is block diagram illustrating a high speed analog to digital converter (ADC) in an embodiment. The high-speed ADC 101 is shown comprising a subtractor 110, loop filter 120, sampler 130, internal ADC 140 and a DAC 150. Each block is described in further detail below.

The loop filter 120 perform santi-aliasing filtering of the signal received on path 112 to removes the high frequency noise due to sampling, quantization and other noise generated in the high-speed ADC 101. The loop filter may be implemented as passive or active RC filters and perform integration operation on the difference signal received on path 112. Loop filter 110 provides the filtered signal on path 123.

The sampler 130 samples the filtered signal on path 123 to generate samples of the filtered signal on path 134 for comparison. The sampler 130 may be implemented to sample at an oversampling rate (the sampling at a rate greater than minimum required rate referred as Nyquist rate as is well known in the art). Due to high sampling rate and noise shaping, the high-speed ADC 101 achieves a resolution of larger number of bits by incorporating a converter of fewer bits. For example, a one-bit converter or 1.5-bit converter may be employed to generate 12-16 bit digital signal by adapting the sampling rate that is higher than the required rate as is well known in the art. The samples are provided on the path 134.

The internal ADC 140 converts each sample to corresponding digital value. For example, the internal ADC 140 may be implemented with two levels quantizer (not shown) and a comparator (not shown) to generate a one-bit digital value. The comparator may compare the sampled value with two quantization levels to generate a digital 1 or 0 bit. Alternatively, the internal ADC may be implemented with three level quantizer and a three-level comparator to generate 1.5 bit digital values. The digital values are provided on the path 145.

The DAC 150 converts the digital values received on the path 145 to the corresponding analog signal. The DAC may generate the analog signal with values corresponding to the received digital values in the form of a voltage or a current corresponding to the digital values received on the path 145. The analog signal may be generated as a differential signal or as a single ended common mode signal suitable for generating a difference signal by the subtractor 110. The analog signal is provided on path 151.

The subtractor 110 generates a difference of the input analog signal on path 105 and the signal received on path 151. The difference may be generated by subtracting the signal on path 151 from the input signal on path 105. The signal on the path 151 required to be faithful representation of the digital values on path 145 for high resolution and accurate conversion of the input analog signal to the digital values.

As mentioned earlier, the conventional DACs introduce error in the analog signal presented to subtractor due to non-linearity in the elements, there by not producing a faithful representation of the digital values to the subtractor. Such error causes reduction of both speed and resolution of the ADC.

In one embodiment, the DAC 150 is implemented to produce an analog value on path 151 with reduced error thereby enhancing the operable speed and resolution of the ADC 101. In that, the element mismatch error is reduced while converting the digital value to corresponding analog value. The ADC 101 provides the digital value on path 109 corresponding to the analog input signal received on path 105.

Figure 2:
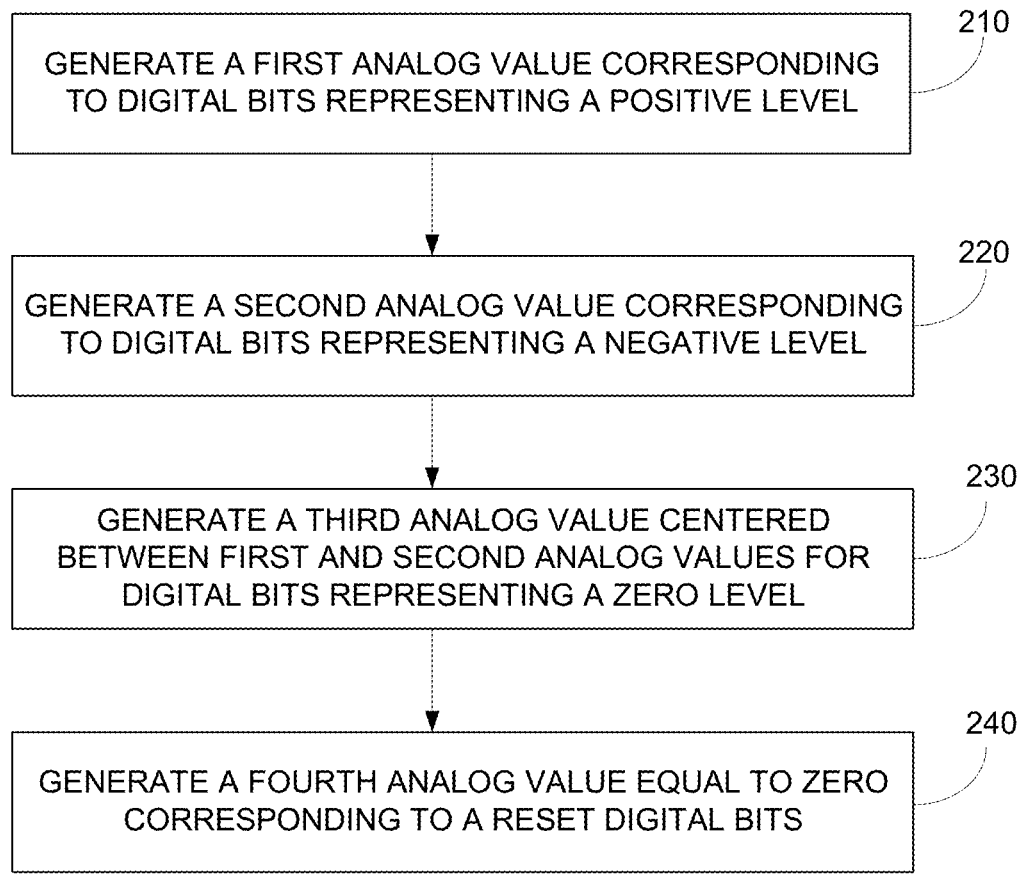
FIG. 2 is a block diagram illustrating a manner in which element mismatch error in a tri-level DAC may be reduced in an embodiment.

FIG. 2 is a block diagram illustrating a manner in which element mismatch error in a tri-level DAC may be reduced in an embodiment. As shown, in the block 210, a first analog value corresponding to digital bits representing a positive level (+1) is generated. In that, the first analog value comprises first error due to element mismatch. In the block 220, a second analog value corresponding to digital bits representing a negative level (−1) is generated. In that, the second analog value comprises second error due to element mismatch. In the block 230, a third analog value corresponding to digital bits representing a zero level ("0") is generated. In that, third analog value is centred between the first and the second analog value so that, the three digital values are represented using three analog values such that the difference between first and the third analog value and the second and third analog values are same or substantially same. In the block 240, a fourth analog value corresponding to a reset signal is generated. In that, the fourth analog value is independent of the first, second and the third analog values. In one embodiment the fourth analog value is generated as equal to zero (voltage/current).

Figure 3:
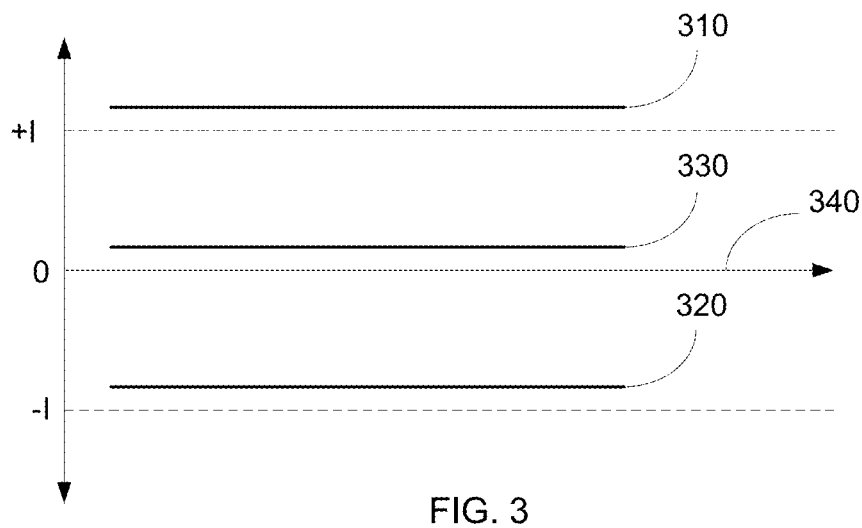
FIG. 3 illustrates the analog signal generated corresponding to the three digital values in an embodiment.

FIG. 3 illustrates the analog signal generated corresponding to the three digital values in an embodiment. The level 310 represents a value of the analog signal generated corresponding to first digital value (for example, in binary form the first digital value may be represented as '01'). Similarly, level 320 represents a value of the analog signal generated corresponding to second digital value (for example, in binary form the second digital value may be represented as '10'). The level 330 represents a value of the analog signal generated corresponding to third digital value (for example, in binary form the third digital value may be represented as '00').

The level 340 represents a value of the analog signal generated corresponding to a reset digital value (for example, in binary form the reset may be represented as '11'). As may be appreciated, the analog value 330 corresponding to the digital zero (00) is positioned at the centre between levels 310 and 320, while the analog level 340 corresponding to the reset has a value zero. In one embodiment, analog values 310-340 represent a current provided as analog signal. In an alternative embodiment, the analog values 310-340 represent a voltage provided as analog signal. In yet another embodiment, the levels 310-340 may represent values of a parameter (say power, for example) other than voltage and current.

In contrast to the conventional DACs, at least, the DAC 150 provides a feedback signal with value 330 instead of a zero-value corresponding to a zero digital value. As a result, error due to elements mismatch is reduced while converting a digital zero to corresponding analog value. Further, the DAC produces a fourth level equal to zero analog signal for a reset. In one embodiment, this reset is used after sending each and every state to remove any memory effect.

FIG. 4 is an example DAC providing analog signal with reduced error due to element mismatch in an embodiment. The DAC 401 is shown comprising current source 410, first reference voltage terminal 420A and B, second reference voltage terminal 430, switches 440A-440D, and the analog signal output port 450. Each element is further described below.

In operation, for example, when digital value is 01, the switches 440B and D are turned on and switches 440C & A are turned off, thereby allowing current 451 to flow to the analog signal port 450. Similarly, when digital value is 10, the switches 440B and D are turned off and switches 440C and A are turned on, thereby allowing a current 452 (negative current) to flow to the analog signal port 450. When digital value is 00, the switches 440B and C are turned on and 440A and D are turned off, thereby allowing current 453 (error current) to flow to the analog signal port 450. When digital value is 11 (or by any other reset signal), the switches 440A and D are turned on and 440B and C are turned off, thereby allowing zero current flow into the analog signal port 450.

As illustrated in FIG. 5, considering a "+I" current as the required current value for digital value 01, the current 451, due to mismatch in the switches 440A-D may be represented as $+I+\Delta i_1$. Similarly, considering a "-I" current as the required current value for digital value 10, the current 452 due to mismatch may be represented as $-I-\Delta i_2$. Since the switches 440B and C are turned on for digital value 00, +I and -I cancels and the current 453 is equal to/proportional to $\Delta i_1 + \Delta i_2$. The current on port 450 may be provided to subtractor 110 on path 151 as a feedback current for more accurate conversion the input analog signal.

Figure 6A:
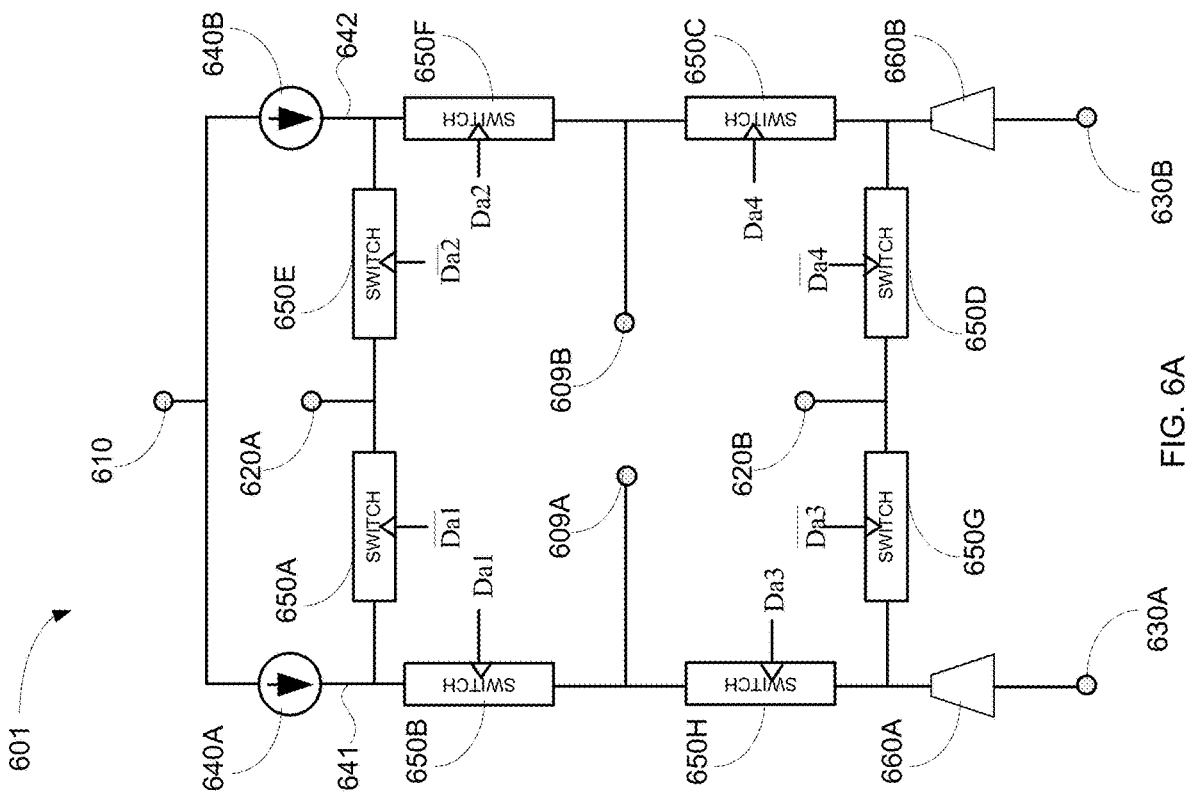
FIG. 6A is an example of DAC in one embodiment providing differential analog signal.

FIG. 6A is an example of DAC in one embodiment providing differential analog signal. The differential DAC 601 is shown comprising supply 610, common mode supply 620A and B, reference voltage 630A and B, current source 640A and B, switches 650A-H, transconductance amplifier 660A and B, and differential analog signal output port 609A and B. Each element is further described below.

The supply 610 provides a positive voltage to the DAC 601. The supply 610 may be a drain voltage Vdd when the switches 650A-H are implemented with CMOS transistors. The reference voltage 630 provide supply sink to the DAC 601. The reference voltage 630 may be set to Vss or any other negative reference voltage when the 650A-H are implemented with CMOS transistors.

The common mode supply 620A and B provide another reference voltage to adjust the output current/voltage corresponding to the digital value. For example, the common mode supply 620 may be adjusted to set the levels of the converted analog signal corresponding to digital values suitable for subtraction by the subtractor 110. Accordingly, the supply 610 (i.e., Vdd), the reference voltage 630 (Vss) and the common mode supply 620A and B are adjusted such that, the switches 650A-H turn on and off by a digital control signal.

In one embodiment, the current sources 640A and B operate to send a constant current through the path 641 and 642. The current sources 640A and B may be deployed by way of electronic circuitry (such as buffers) to maintain a constant current on the paths 641 and 642. The impedance mismatch between the switches 650A-H may result in unequal current division resulting in the mismatch error. The transconductance amplifier 660A and 660B is configured to convert voltage to current to provide current similar to the constant current sources 640A and B.

The switches 650A-H operate to cause a current proportional/corresponding to the digital value flow into and/or out (negative current) the differential port 609 A and B. In one embodiment, the switches are implemented as NMOS (Metal Oxide semiconductor transistor), accordingly, the gate terminal of the NMOS transistors is provided with control digital signal to drive the transistors to on and/or off to cause the analog signal current to flow to the differential port 609A and B.

Figure 6B:
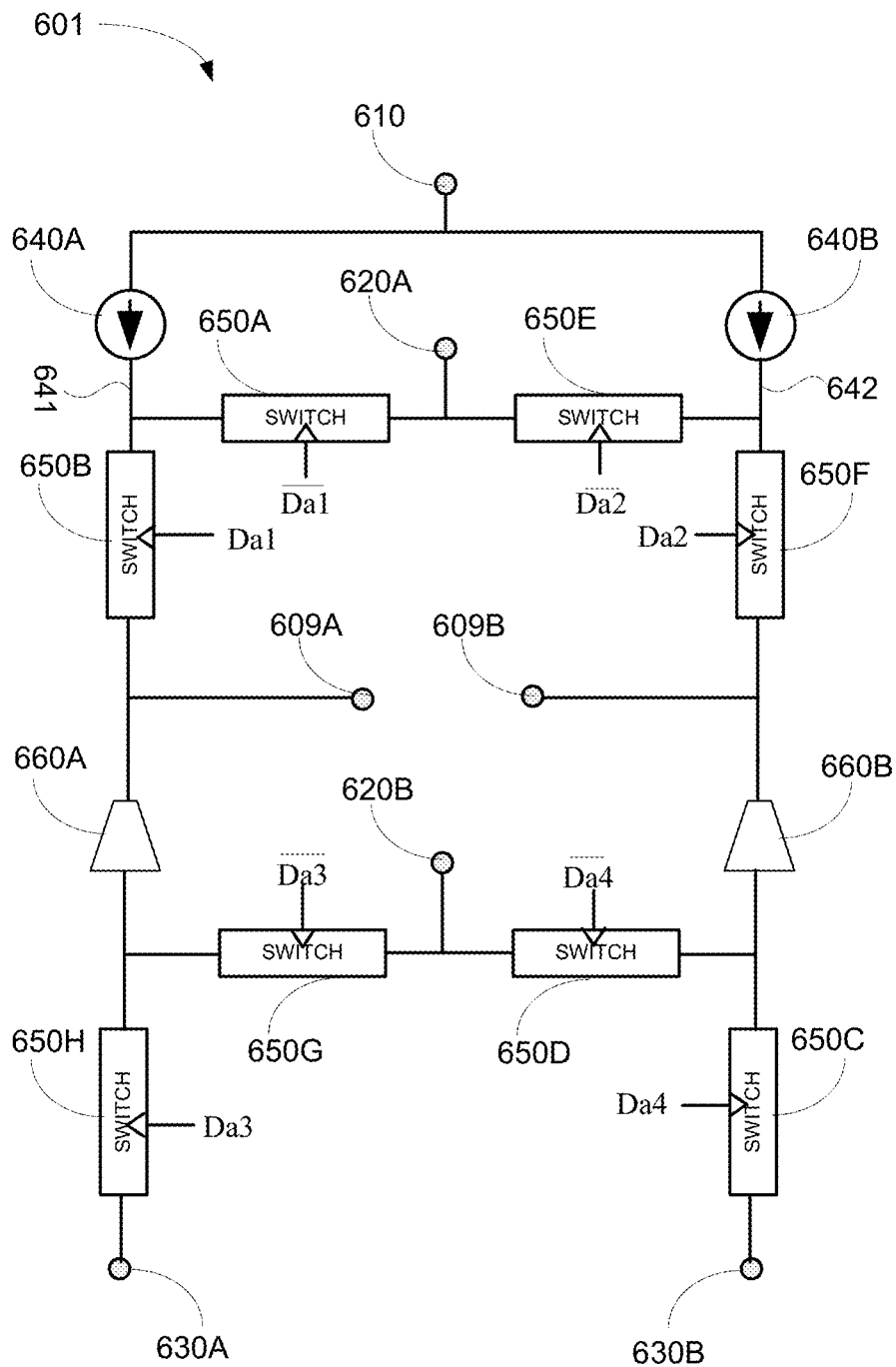
FIG. 6B is an alternative embodiment of the DAC.

In one embodiment, the switches 650B, C, E and G are turned on and switches 650A, D, F and H are turned off when the digital value is 01. The switches 650F, H, A and D are turned on and switches 650E, G, B and C are turned off when the digital value is 10. The switches 650 B, F, H and C are turned on and switches 650 A, E, G and D are turned off when the digital value is 00. The switches 650 A, E, G and D are turned on and switches 650 B, F, H and C are turned off when the digital value is 11. In that, the digital values 10, 01 and 00 are representing three quantization levels of the internal ADC 140 and digital value 11 representing the reset signal. FIG. 6B illustrates the alternative embodiment in which the transconductance amplifier 660A-660B is incorporated to reduce the switching voltage range. In FIG. 6A, the switching range of the switches 650C, D, H, and G is between Vdd and Vcm. Due to the position of the transconductance amplifier as in FIG. 6B, the switching range of the switches 650C, D, H, and G reduces to 0 to Vcm.

Figure 7:
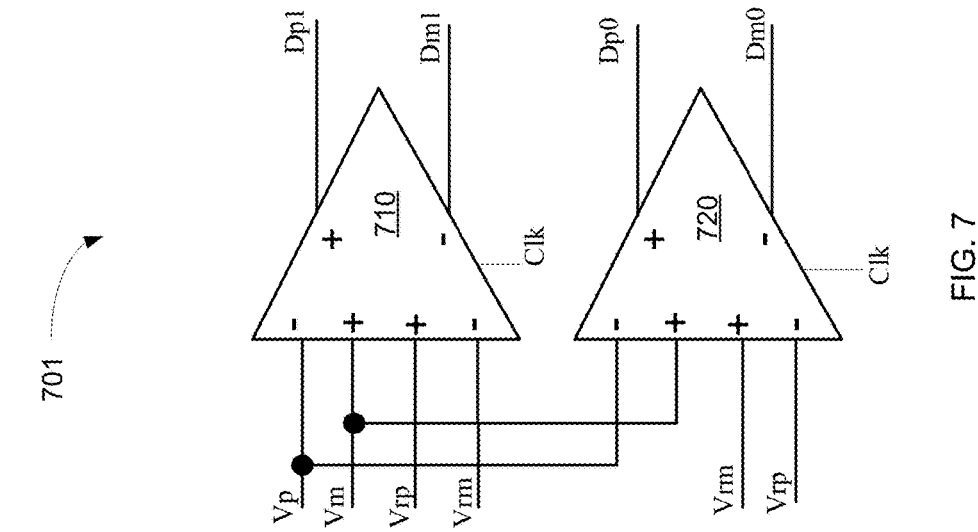
FIG. 7 is an example internal ADC with three quantization level in an embodiment.

FIG. 7 is an example internal ADC with three quantization levels in an embodiment. The internal ADC 701 is shown comprising two differential comparators 710 and 720 comparing the incoming differential analog value (Vp, Vm) with (+Vrp, +Vrm) and (-Vrp, -Vrm) respectively. In that, their quantization levels correspond to value greater than or equal to (Vp, Vm), less than or equal to (-Vrp, -Vrm) and in between the values (+Vrp, +Vrm) and (-Vrp, -Vrm). Accordingly, the two bits differential representations (Dp0, Dp1) and (Dm0, Dm1) are provided on path 145. In one embodiment, the Dp0, Dp1 may be equal to: 01 when the analog value is greater than or equal to (Vp, Vm), 10 when the analog value is less than or equal to (-Vrp, -Vrm), 00 when the analog value is between (+Vrp, +Vrm) and (-Vrp, -Vrm).

Figure 8:
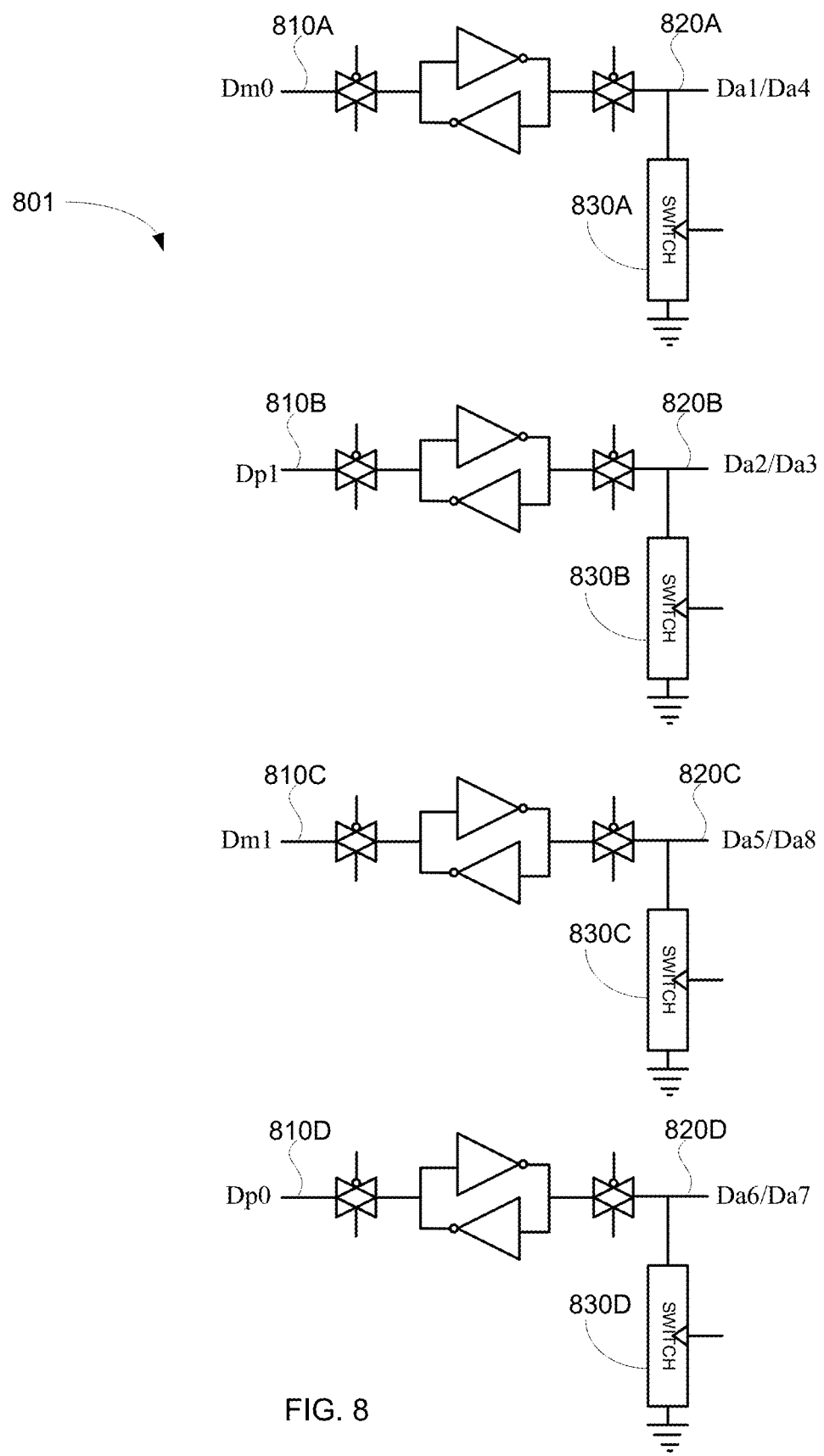
FIG. 8 is a latch providing interconnect between internal ADC and the DAC in an embodiment.

FIG. 8 is a latch providing interconnect between internal ADC 701 and the DAC 601 in an embodiment. In the FIG. 8, standard electronic circuit representation conventions apply. The latch 801 latches the signal on ports 810A-D on to ports 820A-D and holds the signal till next clock signal. In one embodiment, the port 810A is coupled to Dm0, the port 810B is coupled to Dp1, the port 810C is coupled to Dm1 and the port 810D is coupled to Dp0. The switches 830A-D reset the latch 801, in that, the port 820A-D is connected to ground potential (returned to zero). Thus, the ports 820A-D are reset to zero potential when the switches 830A-D are turned on and the port 820A-D holds the digital values (Dp0, Dp1) and (Dm0,Dm1) when the switches are turned off.

The ports 820A-D are coupled to the DAC 601 to operate switches 650A-H. In one embodiment, the port 820A (and its complimentary) is configured to drives the switches 650A, B, G and H. As an alternative, the port 820A alone may drive switches 650A, B, G and H, when switches A and B are implemented as complimentary to G and H.

Similarly, the port 820B drives the switches 650 C, D, E and F. The ports 820C and D may be coupled to drive another DAC element similar to 601 in a dual DAC configuration (not shown) to reduce the peak to average ratio. In that, operation of the two DACs is time interleaved thereby reducing the peak to average ratio of the DAC.

Figure 9:
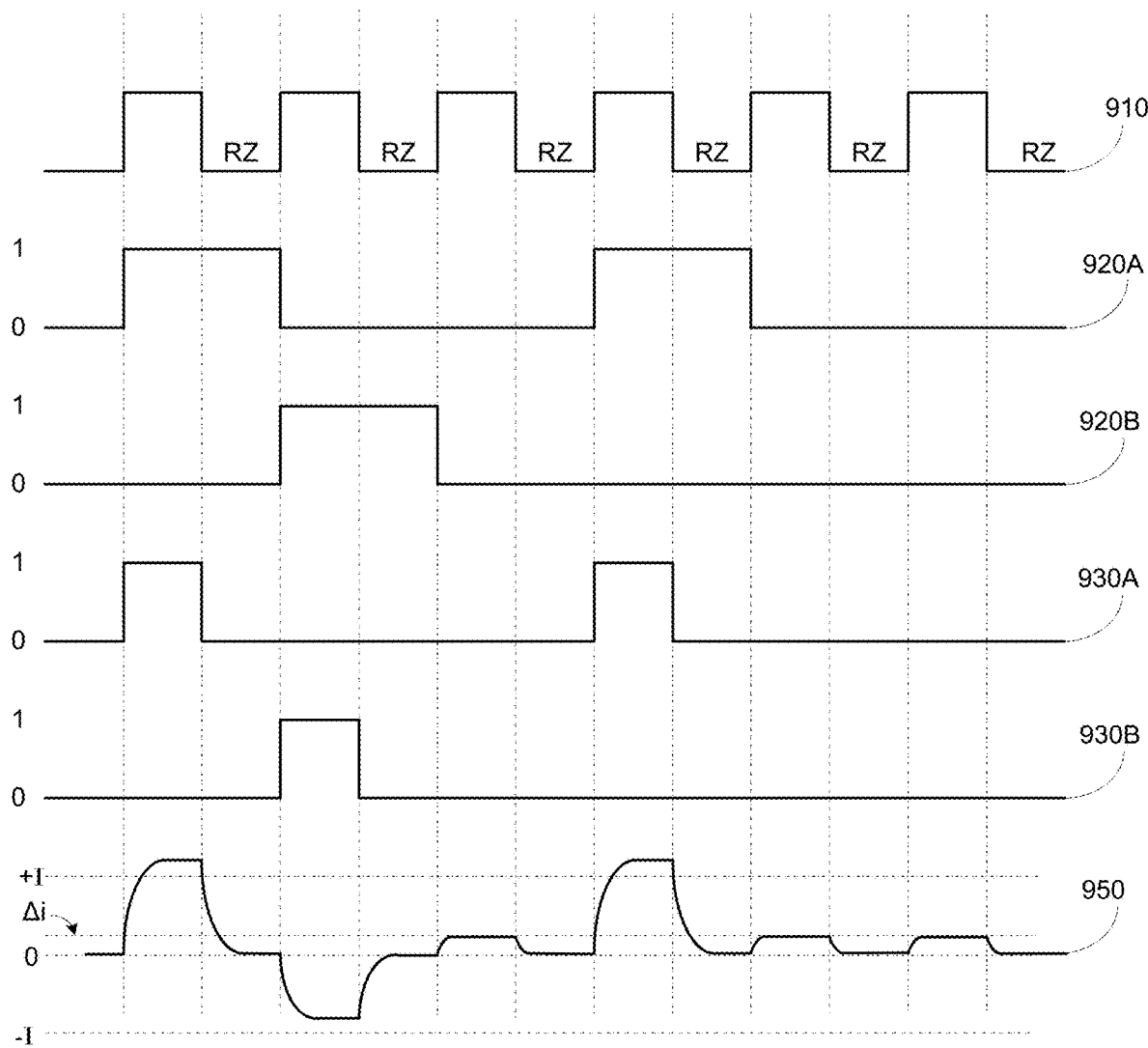
FIG. 9 is a graph illustrating the operation of the DAC in one embodiment.

FIG. 9 is a graph illustrating the operation of the DAC in one embodiment. The graph is shown comprising the clock signal 910, digital first bit 920A, digital second bit 920B, latched signals 930A and 930B, and analog signal 950. The clock signal 910 is shown comprising RZ state (return to Zero). In this state, the switches 830A-830D are turned on to force the value on path 820A-D to zero (ground potential). Also, in this RZ state, all the switches 650A-H are tuned off. Accordingly, no current flows into the port 609A/B. Thus, the analog signal 950 (current) shown with zero level in the RZ state also corresponds to reset state.

When the clock 910 is high, the signal on path 810A-D is respectively latched to the path 820A-D. Accordingly, the 3 digital values represented in two bits by the signal 920A and 920B are provided on path 810A and 810B. For example, when 920A is digital 1 and 920B is digital 0, the two bits are 01 representing one of the three values, similarly, when 920A is digital 0 and 920B is digital 1 the bits are 10, and when both 920A and 920B are digital 0, then bits are 00.

The graph/signal 930A and 930B represents the digital values in the return to zero (RZ) format. The signal 930A and 930B drives the switches 650A-H on or off. For example, when the signal 930A is high the switches 650A and B (and 650 C and D) are turned on and other switches are turned off. Accordingly, current value through port 609A is depicted in the graph 650.

The graph 650 represents the current signal on terminal 609A. As may be appreciated, the current value corresponding to digital value zero (00) is shown as Ai, an error current due to elements mismatch in the DAC 601. The current 650 is shown to have value zero in the reset state and the current 650 is shown to have an error from the desired value +I and −I for the digital values 01 and 10.

While various embodiments of the present disclosure have been described above, it should be understood that they have been presented by way of example only, and not limitation. Thus, the breadth and scope of the present disclosure should not be limited by any of the above-discussed embodiments, but should be defined only in accordance with the following claims and their equivalents.

What is claimed is:

1. A tri-level digital to analog converter (DAC) comprising:
   a first set of switches turned on to cause a first analog value with a first error as an output for a first digital value; and
   a second set of switches turned on to cause a second analog value with a second error as the output for a second digital value;
   wherein, both the first set of switches and the second set of switches are turned on to cause a third analog value, proportional to the first error and the second error, as the output for a digital value equal to zero, and both the first set of switches and the second set of switches are turned off to cause a fourth analog value equal to zero as the output for a fourth digital value representing a reset state.

2. The tri-level DAC of claim 1, further comprising:
   a positive reference voltage source, a negative reference voltage source and a common mode voltage source, in that, the first set of switches, the second set of switches and a first output terminal are electrically coupled to each other to provide the first analog value, second analog value, third analog value and fourth analog value on the first output terminal, wherein the first error and the second error are due to mismatch within the first set of switches and the second set of switches.

3. The tri-level DAC of claim 2, further comprising a third set of switches and a fourth set of switches electrically coupled with the positive reference voltage source, the negative reference voltage source, the common mode voltage source, the first set of switches, the second set of switches, the first output terminal and a second output terminal to form a differential DAC circuitry, in that, the first, the second, third, and the fourth analog values are provided across first output terminal and the second output terminal.

4. The tri-level DAC of claim 2, wherein the first digital value is represented in two bits as 01, second digital value is 10, third digital value is 00 and fourth digital value is 11, in that, two bits are coupled to the first, the second, the third, and the fourth set of switches such that "0" turns the switches on and "1" turns switches off to provide the first, the second, the third and the fourth analog value corresponding to the first, the second, the third, and the fourth digital value.

5. A high-speed analog to digital convertor (ADC) comprising:
   a subtractor configured to generate a difference signal as a difference of an input analog signal and a feedback analog signal;
   a loop filter configured to perform anti-aliasing filtering on the difference signal to provide a filtered difference signal;
   a sampler configured to generate a sequence of samples of the filtered difference signal;
   an internal ADC with three level quantizer is configured to convert each sample to corresponding one of a three digital values; and
   a tri level digital to analog convertor (DAC) configured to generate the feedback analog signal comprising a first analog value with a first error, a second analog value with a second error, and a third analog value corresponding to the three digital values, in that, the third analog value is proportional to the first error and the second error, wherein the first error and the second error are due to element mismatch in the DAC.

6. The high-speed ADC of claim 5, wherein the tri level DAC further comprising;
   a first set of switches turned on to cause the first analog value with the first error as an output for a first digital value; and
   a second set of switches turned on to cause the second analog value with the second error as the output for a second digital value,
   wherein, both the first set of switches and the second set of switches are turned on to cause the third analog value, proportional to the first error and the second error, as the output for a digital value equal to zero, and both the first set of switches and the second set of switches are turned off to cause a fourth analog value equal to zero as the output for a fourth digital value representing a reset state.

7. A method of converting the digital bits representing a positive, a negative and a zero value to corresponding analog values comprising:
   converting the digital bits representing the positive value to first positive analog level;
   converting the digital bits representing the negative value to first negative analog level; and converting the digital bits representing the zero value to an analog level that is centred between the positive analog level and the negative analog level even when the positive analog level and the negative analog level are shifted by a first error and a second error due to an element mismatch.

8. The method of claim 7, further comprising generating a zero analog value for a digital signal representing a reset.

\* \* \* \* \*